US006300185B1

(12) United States Patent
Kubota

(10) Patent No.: US 6,300,185 B1
(45) Date of Patent: Oct. 9, 2001

(54) POLYACRYSTALLINE SILICON FILM FORMATION METHOD

(75) Inventor: Taishi Kubota, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/345,344

(22) Filed: Jul. 1, 1999

(30) Foreign Application Priority Data

Jul. 2, 1998 (JP) .................................................. 10-187184

(51) Int. Cl.⁷ .................... H01L 21/8234; H01L 20/8244
(52) U.S. Cl. ......................... 438/238; 438/142; 438/478; 438/510
(58) Field of Search ..................................... 438/238, 142, 438/738, 510, 629, 478, 455, 155

(56) References Cited

U.S. PATENT DOCUMENTS 5,300,444 * 4/1994 Hachisuka et al. .

FOREIGN PATENT DOCUMENTS 6-151353  5/1994  (JP) .
9-116095  5/1997  (JP) .

* cited by examiner

Primary Examiner—Kevin M. Picardat
Assistant Examiner—D. M. Collins

(57) ABSTRACT

In a method of forming a polycrystalline silicon film, the polycrystalline silicon film is formed under film formation conditions of a film formation rate of $0.9r_{av}$ to $1.1r_{av}$, where $r_{av}$ (nm/minute) is an average rate of forming the polycrystalline silicon film on each of a plurality of substrates on which oxide films are formed so as to provide the roughness of the interface between the oxide film on the substrate and the polycrystalline silicon film of less than 1 nm. As a result, it is possible to decrease the roughness of the interface between a gate oxide film and the polycrystalline silicon film and to improve reliability for ensuring the long-time use of the gate oxide film.

11 Claims, 4 Drawing Sheets

POLYACRYSTALLINE SILICON FILM FORMATION METHOD

BACKGROUND OF THE INVENTION

1. Field of the Invention

The present invention relates to a method of forming a polycrystalline silicon film on a substrate on which surface an oxide film is formed. The present invention relates to, in particular, a method of forming a polycrystalline silicon film capable of improving reliability for using an oxide film for a long time if the polycrystalline silicon film is used as a gate electrode.

2. Description of the Related Art

Normally, a polycrystalline silicon film formed by the CVD (or Chemical Vapor Deposition) method is used as a gate electrode in a semiconductor device. According to the normal CVD method, a polycrystalline silicon film can be formed by introducing silane gas ($SiH_4$ gas) into a vertical or horizontal electric furnace in which several tens of substrates are inserted under a low pressure atmosphere. Conditions for film formation involve, for example, using a vertical furnace, keeping a substrate temperature 650° C., internal pressure of 0.55 Torr and a silane gas flow rate of 1000 sccm. They will be referred to as "first film formation conditions" hereinafter.

FIG. 1 is graph showing the relationship between the interface roughness and the substrate position in a furnace in case of forming a polycrystalline silicon film under the first film formation conditions, wherein the vertical axis indicates the average roughness Rms of the interface between the polycrystalline silicon film and a gate oxide film which serves as a base for the polycrystalline silicon film and the horizontal axis indicates the substrate position in the furnace. The average interface roughness means an average value of the roughness in a single substrate. As shown in FIG. 1, if a polycrystalline silicon film is formed under the first film formation conditions, the average roughness Rms differs according to the substrate positions in the furnace. That is, as a substrate is put at the upper position in the furnace, the average roughness of the interface between the polycrystalline silicon film and the gate oxide film is higher.

In addition, a polycrystalline silicon film can be formed under conditions that the pressure of the interior of the furnace is 0.5 Torr and that silane gas flow rate is 1000 sccm with a substrate temperature in the furnace kept 600° C. These conditions will be referred to as "the second film formation conditions" hereinafter. FIG. 2 is graph showing the relationship between the interface roughness and the substrate position in a furnace in case of forming a polycrystalline silicon film under the second film formation conditions, wherein the vertical axis indicates the average roughness Rms of the interface between the polycrystalline silicon film and a gate oxide film which serves as a base for the polycrystalline silicon film and the horizontal axis indicates the substrate position in the furnace. As shown in FIG. 2, if a polycrystalline silicon film is formed under the second film formation conditions, the average roughness of the interface between the polycrystalline silicon film and the gate oxide film is higher as a substrate is put at the lower position in the furnace.

However, the following problems occur if forming a polycrystalline silicon film under the conventional first or second film formation conditions and forming an MOS transistor having a gate electrode consisting of this polycrystalline silicon film.

FIGS. 3 and 4 are graphs each showing the relationship between the weibull of the upper substrate and the lower substrate in the furnace and the Qbd value, wherein the horizontal axis indicates the Qbd value. A Qbd value is an index for reliability for long-time use of an oxide film in MOS structure. If the Qbd value is higher, it is indicated that reliability for long-time use of an oxide film is better. It is noted that FIG. 3 concerns an MOS capacitor in case of using the polycrystalline silicon film obtained under the first film formation conditions as a gate electrode for the MOS capacitor and that FIG. 4 concerns an MOS capacitor in case of using the polycrystalline silicon film obtained under the second film formation conditions as a gate electrode for the MOS capacitor.

As shown in FIG. 3, if a polycrystalline silicon film is formed under the first film formation conditions, the Qbd value of the oxide film on a substrate put at a higher position in the furnace is lower than that of the oxide film on a substrate put at a lower position in the furnace. Also, as shown in FIG. 4, if a polycrystalline silicon film is formed under the second film formation conditions, the Qbd value of the oxide film on a substrate put at a lower position in the furnace is lower than that of the oxide film on a substrate put at a higher position in the furnace. Obviously, in the conventional polycrystalline silicon film formation method, the Qbd value of the oxide film varies according to the substrate position in the furnace and it is impossible to obtain a desired Qbd value.

A technique for improving the withstand voltage of a capacitive insulating film by setting the average roughness of the surface of the capacitive insulating film at 80Å A or less in a semiconductor device having the capacitive insulating film between two polycrystalline silicon films, is disclosed (by, for example, Japanese Patent Application Laid-Open No. Hei-9-116095). The technique is intended to adjust the average roughness of the surface of the capacitive insulating film by controlling conditions for forming a polycrystalline silicon film which serves as a base of the capacitive insulating film.

However, a substrate serves as a base for a gate oxide film in MOS structure. It is, thus, impossible to apply the method described in Japanese Patent Application Laid-Open No. Hei-9-116095 to MOS structure.

Further, as a method for manufacturing a semiconductor device having a gate electrode of polycide structure, there is well known a method for forming a silicide layer on a polycrystalline silicon layer having an average surface roughness of 1 nm or less (Japanese Patent Application Laid-Open No. Hei-6-151353). According to the method, even if the line width of the gate electrode is made very small, it is possible to prevent the silicide layer from coagulating or peeling off and the sheet resistance of the electrode from increasing.

Nevertheless, the surface roughness of the gate oxide film or the roughness of the interface between the gate oxide film and the polycrystalline silicon film is not described in Japanese Patent Application Laid-Open No. Hei-6-151353. Thus, according to this method, it is impossible to improve the withstand voltage of the gate oxide film and reliability.

SUMMARY OF THE INVENTION

It is, therefore, an object of the present invention to provide a method of forming a polycrystalline silicon film capable of decreasing the roughness of the interface between a gate oxide film and the polycrystalline silicon film and improving reliability for long-time use of the gate oxide film.

In a polycrystalline silicon film formation method according to the present invention, a plurality of substrates are, is put in a reaction furnace. An oxide film is formed on a surface of each of the plurality of substrates. A polycrystalline silicon film is formed on the oxide film in the reaction furnace. The method is characterized in that the polycrystalline silicon film is formed under a film formation rate of $0.9r_{av}$ to $1.1r_{av}$ and an internal temperature of the reaction furnace of $T_{av}-10°$ C. to $T_{av}+10°$ C., where $r_{av}$ (nm/minute) is an average rate of forming the polycrystalline silicon film on each of the plurality of substrates and $T_{av}°$ C. is an average temperature of the interior of the reaction furnace. After formation of said polycrystalline silicon film, a roughness of an interface between the oxide film and the polycrystalline silicon film is less than 1 nm.

The interface roughness is measured by cross-section TEM observation, observation after removing the polycrystalline silicon film or the like.

The film formation rate may be determined in association with an internal pressure of the reaction furnace and a gas flow rate.

The material of the polycrystalline silicon film may be silane gas. The reaction furnace may be a vertical electric furnace.

The polycrystalline silicon film may be used as a gate electrode of an MOS capacitor.

According to the present invention, the polycrystalline silicon film formation conditions are determined so as to provide the roughness of the interface between the oxide film on the substrate and the polycrystalline silicon film of less than 1 nm for all of the substrates put in the furnace. Thus, it is possible to improve reliability for long-time use of the oxide film.

DESCRIPTION OF THE PREFERRED EMBODIMENTS

Figure 1:
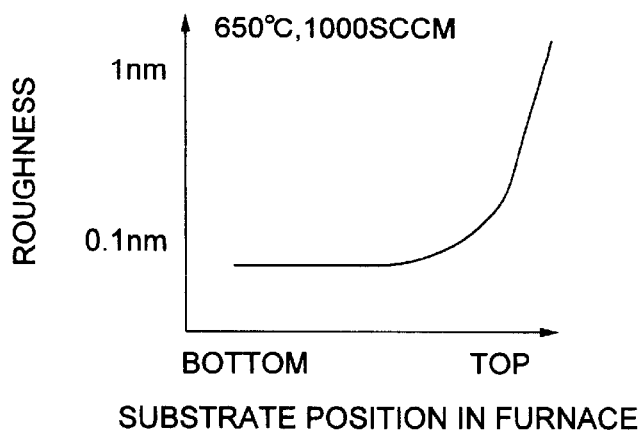
FIG. 1 is a graph showing the relationship between the interface roughness and the substrate position in a furnace in case of forming a polycrystalline silicon film under the first film formation conditions, wherein the vertical axis indicates the average roughness Rms of the interface between the polycrystalline silicon film and a gate oxide film which serves as a base for the polycrystalline silicon film and the horizontal axis indicates the substrate position in the furnace.
Figure 2:
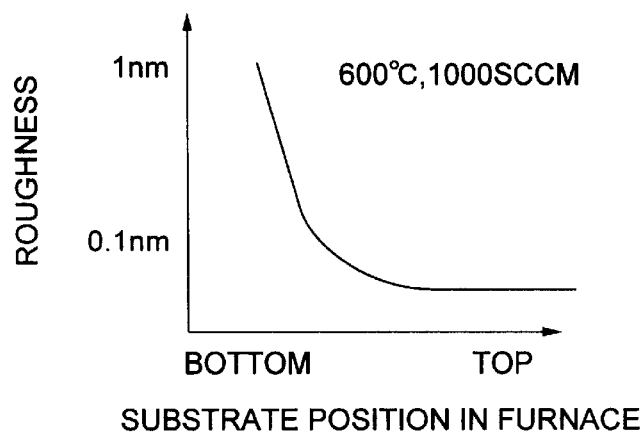
FIG. 2 is a graph showing the relationship between the interface roughness and the substrate position in a furnace in case of forming a polycrystalline silicon film under the second film formation conditions, wherein the vertical axis indicates the average roughness Rms of the interface between the polycrystalline silicon film and a gate oxide film which serves as a base for the polycrystalline silicon film and the horizontal axis indicates the substrate position in the furnace.
Figure 3:
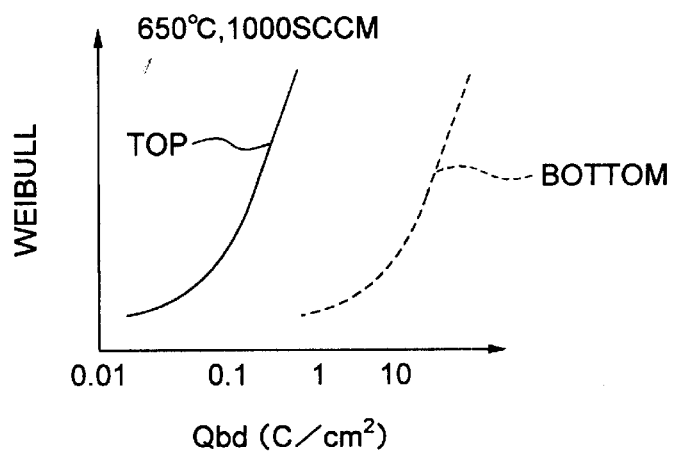
FIG. 3 is a graph showing the relationship between the weibull of the upper substrate and the lower substrate in the furnace and the Qbd value, wherein the horizontal axis indicates the Qbd value.
Figure 4:
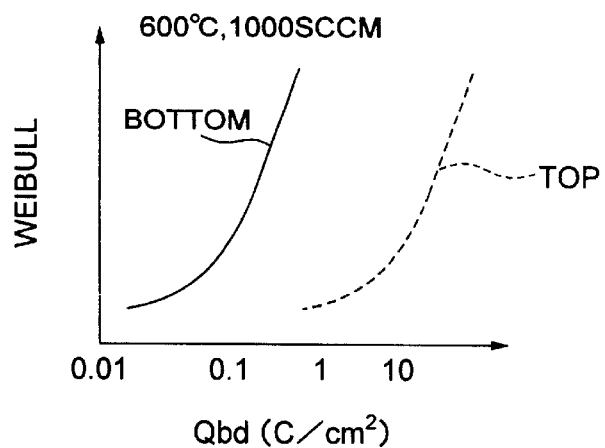
FIG. 4 is a graph showing the relationship between the weibull of the upper substrate and the lower substrate in the furnace and the Qbd value, wherein the horizontal axis indicates the Qbd value.

According to the present invention, a polycrystalline silicon film is formed on a gate insulating film formed on a semiconductor substrate so as to provide the average roughness of the interface between the gate oxide film and the polycrystalline silicon film of less than 1 nm for a substrate put at every position in the furnace. Polycrystalline silicon film formation conditions involve such parameters as temperature, pressure and gas flow rate in the furnace. In the conventional formation methods, the average Rms of the roughness of the interface between the gate oxide film and the polycrystalline silicon film differs according to the positions of the substrates in the furnace and some substrates have 1 nm or more RMS. Owing to this, the reliability for long-time use of the gate oxide film formed on such substrates deteriorates.

After experiment and study, the inventor of the present invention discovered that it is effective to make the polycrystalline silicon film formation rate uniform in the reaction furnace under the film formation condition of the average interface roughness RMS of less than 1 nm for a substrate put at every position in the furnace. It is assumed that the average temperature of the interior of the reaction furnace is $T_{av}$ (° C.) and the average rate of forming a polycrystalline silicon film is $r_{av}$ (nm/minute). If the internal temperature of the reaction furnace is set at 0.9 $T_{av}$ to 1.1 $T_{av}$ and the slowest film formation rate $r_L$ of the substrate is less then 0.9 $r_{av}$ or the fastest film formation rate $r_H$ of the substrate exceeds 1.1 $r_{av}$, then the interface roughness Rms for some of the substrates in the furnace is 1 nm or more and reliability for long-time use of the gate oxide film deteriorates. According to the present invention, therefore, a polycrystalline silicon film is formed on a gate oxide film such that the film formation rate falls within the range of 0.9 $r_{av}$ to 1.1 $r_{av}$ for a substrate at every position in the reaction furnace.

In order to provide the film formation rate of 0.9 $r_{av}$ to 1.1 $r_{av}$ for a substrates put at every position in the furnace, it is necessary to obtain optimum conditions by changing, for example, the temperature, pressure and gas flow rate in the furnace. In case of using a vertical CVD furnace, for example, several tens of substrates are put in the furnace and a polycrystalline silicon film is formed on every substrate. In this case, it is possible to make the rate of forming polycrystalline silicon films on a plurality of substrates, respectively, by adjusting the pressure and gas flow rate while the temperature of the interior of the furnace is being kept as constant as possible. In particular, if the average temperature of the interior of the furnace is $T_{av}$(° C.), it is desirable that the temperature of the interior of the furnace is $T_{av}-10$(° C.) to $T_{av}+10$(° C.). If selecting film formation conditions as stated above, it is possible to provide the average interface roughness Rms of less than 1 nm for every position in the furnace.

Now, a polycrystalline silicon film formation method in the first embodiment according to the present invention will be described specifically. First, several tens of substrates each having a gate oxide film formed on a surface thereof are put in a vertical electric furnace and the low pressure atmosphere is set in the furnace. Next, while the temperature of the interior of the furnace is kept a constant temperature of 650° C. from the upper to lower positions of the furnace, the pressure of the interior of the furnace is set at 0.5 Torr and silane gas ($SiH_4$ gas) is introduced at a flow rate of 2000 sccm, thereby forming a polycrystalline silicon film on the gate oxide film.

Figure 5:
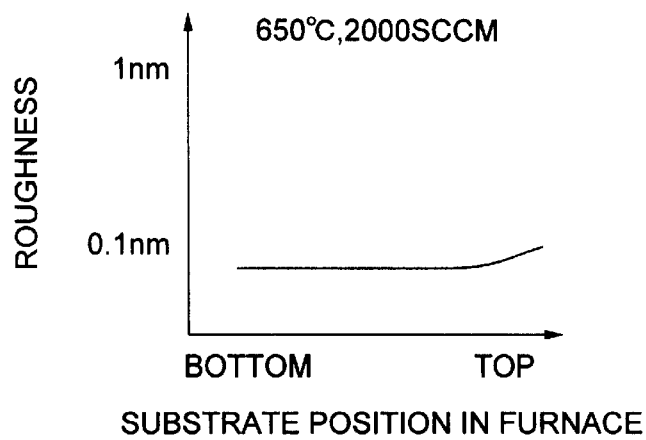
FIG. 5 is a graph showing the relationship between the interface roughness and the position in the furnace in im case of forming a polycrystalline silicon film by a method in the first embodiment wherein the vertical axis indicates the average roughness Rms of the interface between the polycrystalline silicon film and the gate oxide film and the horizontal axis indicates the substrate position in the furnace.
Figure 6:
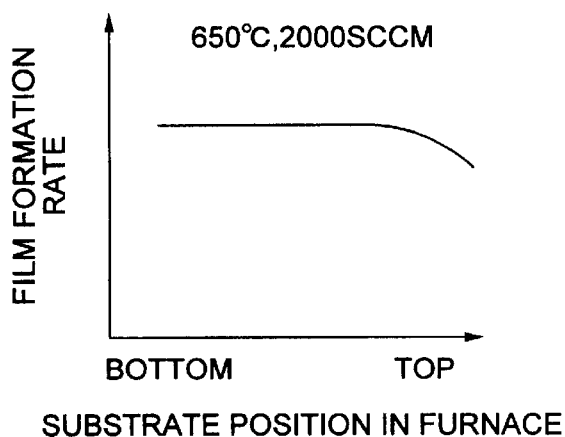
FIG. 6 is a graph showing the relationship between the film formation rate and the substrate position in the furnace in im case of forming a polycrystalline silicon film by the method in the first embodiment, wherein the vertical axis indicates the film formation rate of the polycrystalline silicon film and the horizontal axis indicates the substrate position in the furnace.
Figure 7:
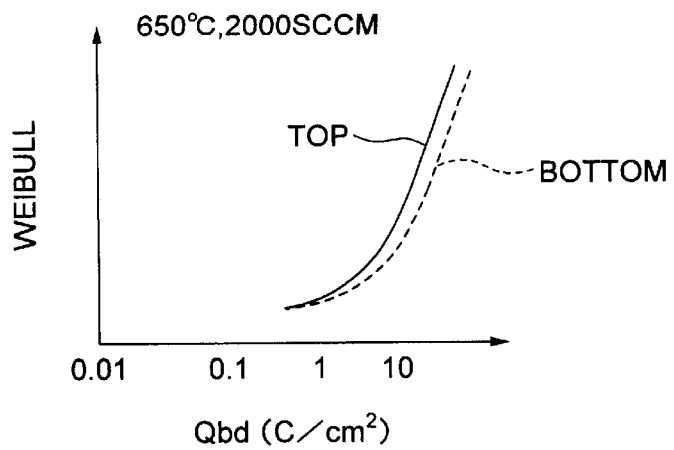
FIG. 7 is a graph showing the relationship between the weibull of the upper substrate and the lower substrate in the furnace and the Qbd value, wherein the vertical axis indicates weibull and the horizontal axis indicates the Qbd value of the gate oxide film.

FIG. 5 is a graph showing the relationship between the interface roughness and the position in the furnace in case of forming a polycrystalline silicon film by a method in the first embodiment. In the graph, the vertical axis indicates the average roughness of the interface between the polycrystalline silicon film and the gate oxide film and the horizontal axis indicates the position of the substrate in the furnace. FIG. 6 is a graph showing the relationship between the film formation rate and the substrate position in the furnace in case of forming a polycrystalline silicon film by the method in the first embodiment, wherein the vertical axis indicates the film formation rate of the polycrystalline silicon film and the horizontal axis indicates the substrate position in the furnace. Further, FIG. 7 is a graph showing the relationship between the weibull of the upper substrate and the lower substrate in the furnace and the Qbd value, wherein the vertical axis indicates weibull and the horizontal axis indicates the Qbd value of the gate oxide film. It is noted that Qbd value is obtained if a polycrystalline silicon film is used as a gate electrode and an MOS capacitor is formed.

Figure 8:
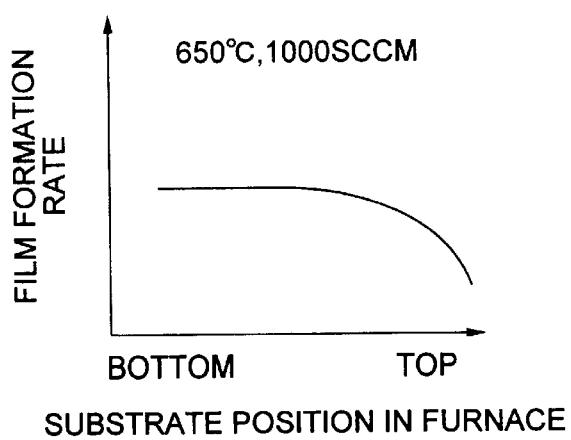
FIG. 8 is a graph showing the relationship between the film formation rate and the substrate position in the furnace in case of forming a polycrystalline silicon film under the conventional first film formation conditions, wherein the vertical axis indicates the film formation rate of the polycrystalline silicon film and the horizontal axis indicates the substrate position in the furnace.

FIG. 8 is a graph showing the relationship between the film formation rate and the substrate position in the furnace in case of forming a polycrystalline silicon film under the conventional first film formation conditions, wherein the vertical axis indicates the film formation rate of the polycrystalline silicon film and the horizontal axis indicates the substrate position in the furnace.

As shown in FIG. 5, in case of forming a polycrystalline silicon film by the method in the first embodiment, the average interface roughness Rms for the substrate put at the upper position in the furance is higher than that for the substrate put at the lower position in the furance. However, even with the substrate put at the upper position in the furance, the average roughness Rms is about 0.1 nm. The reason is as follows. As shown in FIG. 6, the polycrystalline film formation rate of the substrate put at the upper position in the furnace is lower than that of the furance put at the lower position in the substrate. However, while the average film formation rate is $R_{av}$, the rate for a substrates at every position in the furnace is 0.9 $r_{av}$ to 1.1 $r_{av}$. As a result, as shown in FIG. 7, a desired Qbd value can be obtained irrespectively of the substrate position in the furnace.

Meanwhile, as shown in FIG. 8, under the conventional first film formation conditions, the polycrystalline film formation rate of the substrate put at the upper position in the furnace is considerably slower than that of the substrate put at the lower position in the furnace. Thus, the Qbd value of the gate oxide film is lowered for, in particular, the substrate put at the upper position in the furnace.

Next, a polycrystalline film formation method in the second embodiment according to the present invention will be specifically described. The second embodiment differs from the first embodiment only in film formation conditions. That is, while the temperature of the interior of the furnace is kept a constant temperature of 600° C. from the upper to lower positions of the furnace, the pressure of the interior of the furnace is set at 0.5 Torr and silane gas ($SiH_4$ gas) is introduced at a flow rate of 500 sccm, thereby forming a polycrystalline silicon film on the gate oxide film.

Figure 9:
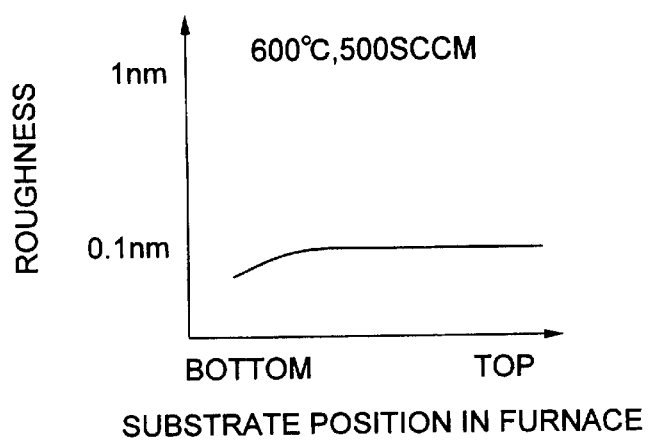
FIG. 9 is a graph showing the relationship between the interface roughness and the position in the furnace in im case of forming a polycrystalline silicon film by a method in the second embodiment, wherein the vertical axis indicates the average roughness of the interface between the polycrystalline silicon film and the gate oxide film and the horizontal axis indicates the position of the substrate in the furnace.
Figure 10:
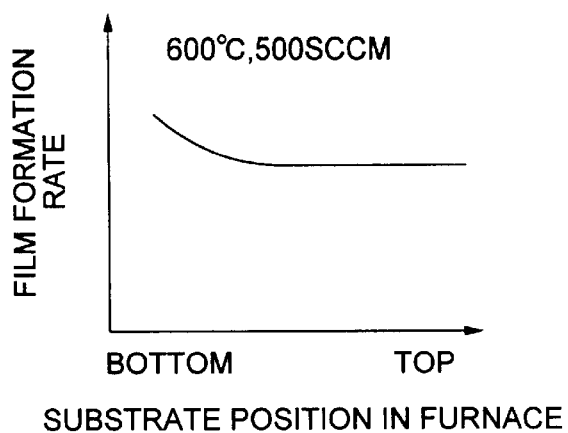
FIG. 10 is a graph showing the relationship between the film formation rate and the substrate position in the furnace in case of forming a polycrystalline silicon film by the method in the second embodiment, wherein the vertical axis indicates the film formation rate of the polycrystalline silicon film and the horizontal axis indicates the substrate position in the furnace.
Figure 11:
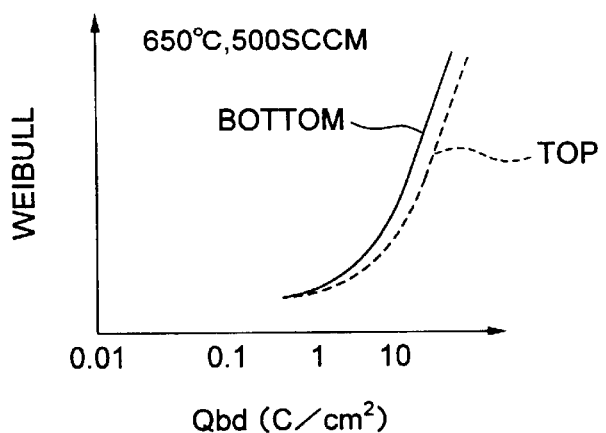
FIG. 11 is a graph showing the relationship between the weibull of the upper substrate and the lower substrate in the furnace and the Qbd value, wherein the vertical axis indicates weibull and the horizontal axis indicates the Qbd value of the gate oxide film.

FIG. 9 is a graph showing the relationship between the interface roughness and the position in the furnace in case of forming a polycrystalline silicon film by a method in the second embodiment. In the graph, the vertical axis indicates the average roughness of the interface between the polycrystalline silicon film and the gate oxide film and the horizontal axis indicates the position of the substrate in the furnace. FIG. 10 is a graph showing the relationship between the film formation rate and the substrate position in the furnace in case of forming a polycrystalline silicon film by the method in the second embodiment, wherein the vertical axis indicates the film formation rate of the polycrystalline silicon film and the horizontal axis indicates the substrate position in the furnace. Further, FIG. 11 is a graph showing the relationship between the weibull of the upper substrate and the lower substrate in the furnace and the Qbd value, wherein the vertical axis indicates weibull and the horizontal axis indicates the Qbd value of the gate oxide film.

Figure 12:
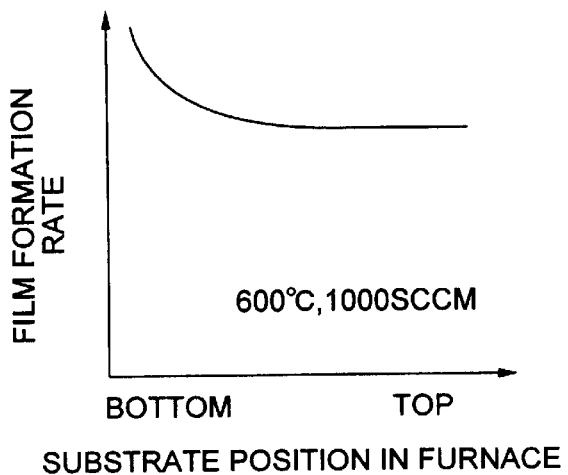
FIG. 12 is a graph showing the relationship between the film formation rate and the substrate position in the furnace in im case of forming a polycrystalline silicon film under the conventional second film formation conditions, wherein the vertical axis indicates the film formation rate of the polycrystalline silicon film and the horizontal axis indicates the substrate position in the furnace.

FIG. 12 is a graph showing the relationship between the film formation rate and the substrate position in the furnace in case of forming a polycrystalline silicon film under the conventional second film formation conditions, wherein the vertical axis indicates the film formation rate of the polycrystalline silicon film and the horizontal axis indicates the substrate position in the furnace.

As shown in FIG. 9, in case of forming a polycrystalline silicon film by the method in the second embodiment, the average interface roughness Rms for the substrate put at the upper position in the furance is higher than that for the substrate put at the lower position in the furance. However, even with the substrate put at the upper position in the furance, the average roughness Rms is about 0.1 nm. The reason is as follows. As shown in FIG. 10, if a polycrystalline silicon film is grown at a substrate temperature of 600° C., the absolute value of the film formation rate is considerably different from that in case of a substrate temperature of 650° C. The film formation rate, which is not dependent on the substrate position in the furnace, is almost constant and the rate is $0.9r_{av}$ to $1.1r_{av}$ for the substrate in every position in the furnace. As a result, as shown in FIG. 11, a desired Qbd value can be obtained irrespectively of the substrate position in the furnace.

Meanwhile, as shown in FIG. 12, under the conventional second film formation conditions, the polycrystalline film formation rate of the substrate put at the upper position in the furnace is considerably slower than that of the substrate put at the lower position in the furnace. Thus, the Qbd value of the gate oxide film is lowered for, in particular, the substrate put at the upper position in the furnace.

What is claimed is:

1. A polycrystalline silicon film formation method, comprising:

putting a plurality of single crystal semiconductor substrates in a reaction furnace, an oxide film being formed on a surface of each of the plurality of substrates; and forming a polycrystalline silicon film on said oxide film in said reaction furnace, said polycrystalline silicon film being formed under a film formation rate of $0.9\ r_{av}$ to $1.1\ r_{av}$, and an internal temperature range of the reaction furnace of $T_{av}$–10° C. to $T_{av}$+10° C., where $r_{av}$ (nm/minute) is an average rate of forming the polycrystalline silicon film on each of the plurality of substrates, and $T_{av}$°C. is an average temperature of the interior of the reaction furnace, wherein after formation of said polycrystalline silicon film, an average RMS roughness of an interface between said oxide film and said polycrystalline silicon film is less than 1 nm.

2. The method according to claim 1, wherein the film formation rate is determined in association with an internal pressure of the reaction furnace and a gas flow rate.

3. The method according to claim 1, wherein material of the polycrystalline silicon film is silane gas.

4. The method according to claim 2, wherein material of the polycrystalline silicon film is silane gas.

5. The method according to claim 1, wherein the reaction furnace is a vertical electric furnace.

6. The method according to claim 2, wherein the reaction furnace is a vertical electric furnace.

7. The method according to claim 3, wherein the reaction furnace is a vertical electric furnace.

8. The method according to claim 1, wherein the polycrystalline silicon film is used as a gate electrode of an MOS capacitor.

9. The method according to claim 2, wherein the polycrystalline silicon film is used as a gate electrode of an MOS capacitor.

10. The method according to claim 3, wherein the polycrystalline silicon film is used as a gate electrode of an MOS capacitor.

11. The method according to claim 5, wherein the polycrystalline silicon film is used as a gate electrode of an MOS capacitor.

* * * * *